(12) United States Patent
Gong et al.

(10) Patent No.: US 11,418,012 B2
(45) Date of Patent: Aug. 16, 2022

(54) STRUCTURED BEAM GENERATION DEVICE AND METHOD BASED ON BEAM SHAPING

(71) Applicant: ZHEJIANG UNIVERSITY, Zhejiang (CN)

(72) Inventors: Wei Gong, Zhejiang (CN); Ke Si, Zhejiang (CN); Jiajia Chen, Zhejiang (CN)

(73) Assignee: ZHEJIANG UNIVERSITY, Zhejiang (CN)

( * ) Notice: Subject to any disclaimer, the term of this patent is extended or adjusted under 35 U.S.C. 154(b) by 196 days.

(21) Appl. No.: 17/042,958

(22) PCT Filed: Jul. 12, 2019

(86) PCT No.: PCT/CN2019/095843
§ 371 (c)(1),
(2) Date: Sep. 29, 2020

(87) PCT Pub. No.: WO2020/093727
PCT Pub. Date: May 14, 2020

(65) Prior Publication Data
US 2021/0098973 A1    Apr. 1, 2021

(30) Foreign Application Priority Data
Nov. 6, 2018   (CN) .................. 201811313857.3

(51) Int. Cl.
*H01S 5/40*      (2006.01)
*G01B 11/24*     (2006.01)
*G02B 27/28*     (2006.01)

(52) U.S. Cl.
CPC ........ *H01S 5/4012* (2013.01); *G01B 11/2441* (2013.01); *G02B 27/283* (2013.01); *G02B 27/286* (2013.01)

(58) Field of Classification Search
None
See application file for complete search history.

(56) References Cited

FOREIGN PATENT DOCUMENTS

| CN | 1757479 | 4/2006 |
|---|---|---|
| CN | 102244335 | 11/2011 |

(Continued)

OTHER PUBLICATIONS

"International Search Report (Form PCT/ISA/210) of PCT/CN2019/095843," dated Sep. 26, 2019, with English translation thereof, pp. 1-4.

*Primary Examiner* — Michelle M Iacoletti
*Assistant Examiner* — Danell L Owens
(74) *Attorney, Agent, or Firm* — JCIP Global Inc.

(57) ABSTRACT

A structured beam generation device based on beam shaping and a method adopting the device are provided. Linearly polarized beam emitted by a laser sequentially passes through an electro-optic intensity modulator, a half-wave plate, and a first beam expander, and then enters a first polarization beam-splitting prism to be transmitted and reflected. The transmitted beam sequentially passes through a beam shaper, an optical delay line, and a first reflector to form a parallel ring-shaped beam to be transmitted by a second polarization beam-splitting prism. The reflected beam sequentially passes through an electro-optic phase modulator, a second reflecting mirror, and a second beam expander, and is then reflected by the second polarization beam-splitting prism and combined with the transmitted beam into a beam, which is then adjusted by a polarizing plate have consistent polarization direction, and is finally focused at a focal plane by a focusing lens for interference.

9 Claims, 4 Drawing Sheets

(56) References Cited

FOREIGN PATENT DOCUMENTS

| | | | |
|---|---|---|---|
| CN | 102540476 | 7/2012 | |
| CN | 104374755 | 2/2015 | |
| CN | 108645751 | 10/2018 | |
| CN | 208171850 U | * 11/2018 | ............ G01N 21/65 |
| CN | 109490201 | 3/2019 | |
| JP | 2010060751 | 3/2010 | |

* cited by examiner

STRUCTURED BEAM GENERATION DEVICE AND METHOD BASED ON BEAM SHAPING

CROSS-REFERENCE TO RELATED APPLICATION

This application is a 371 application of the International PCT application serial no. PCT/CN2019/095843, filed on Jul. 12, 2019, which claims the priority benefit of China application no. 201811313857.3, filed on Nov. 6, 2018. The entirety of each of the abovementioned patent applications is hereby incorporated by reference herein and made a part of this specification.

BACKGROUND

Technical Field

The disclosure relates to the field of laser application technology, and in particular to a structured beam generation device and method based on beam shaping.

Description of Related Art

Structured beam illumination technology improves the illumination manner thereof based on the conventional optical microscope, and an image is formed with specially modulated structured beam, thereby obtaining a high-resolution sample information method. The structured beam is generated mainly through adding an optical modulation device, such as a spatial light modulator, a digital micromirror array, or a binary optical element, to an illumination optical path. The illumination beam is modulated and then irradiated onto the focal plane of a sample, while the defocus plane is not affected. A fluorescence signal excited by the modulated beam irradiating the sample is collected by a photodetector through an imaging system. The illumination beam of a specific structure transfers a portion of information outside the range of an optical transfer function to within the range during the imaging process, and moves high-frequency information within the range to the original position using a specific algorithm, thereby expanding frequency domain information of the sample through the microscopic system.

The current structured beam microscopy imaging method can only perform microscopy imaging on the surface of a sample, and cannot effectively perform microscopy imaging at a certain depth of thick biological tissue. In addition, during the generating process of structured beam, it is often necessary to perform partition modulation on the beam. In the traditional partition modulation method, diffraction effects such as edge diffraction or slit diffraction will adversely affect the system, so the modulation efficiency and the beam energy utilization rate cannot be guaranteed. Such deficiencies limit the signal-to-noise ratio and imaging depth of microscopy imaging. The application of structured beam illumination based on beam shaping according to the disclosure can effectively solve such issues in the field of microscopy imaging, and greatly improve the ability of deep-layer non-destructive imaging of biological tissue.

SUMMARY

In order to solve the issues in the background art, the disclosure provides a structured beam generation device and method based on beam shaping by combining structure of Mach-Zehnder interferometer and the characteristics of polarization beam-splitting prism, so as to provide novel, rational and effective solutions for structured beam illumination.

The technical solutions adopted by the disclosure are:

1. A structured beam generation device based on beam shaping:

The device includes a laser, an electro-optical intensity modulator, a half-wave plate, a first beam expander, a first polarization beam-splitting prism, a beam shaper, an optical delay line, a first reflector, an electro-optical phase modulator, a second reflector, a second expander, a second polarization beam-splitting prism, a polarizing plate, and a focusing lens on optical paths thereof. A linearly polarized beam emitted by the laser, after sequentially being power modulated by the electro-optical intensity modulator, polarization state adjusted by the half-wave plate, collimated and expanded by the first beam expander, and incident on the first polarization beam-splitting prism, is transmitted and reflected to be divided into two beams with equal power. The beam transmitted by the first polarization beam-splitting prism is a first path beam. The first path beam, after sequentially being shaped by the beam shaper into a parallel hollow ring-shaped beam and adjusted in an optical path difference thereof by the optical delay line, is reflected by the first reflector and is then incident on the second polarization beam-splitting prism so as to be transmitted. The beam reflected by the first polarization beam-splitting prism is a second path beam. The second path beam, after sequentially being phase modulated by the electro-optical phase modulator, reflected by the second reflector, and expanded by the second beam expander, is incident on the second polarization beam-splitting prism so as to be reflected. The first path beam transmitted by the second polarization beam-splitting prism and the second path beam reflected by the second polarization beam-splitting prism are complementarily combined into a beam that incidents on the polarizing plate, which is then adjusted by the polarizing plate into a beam with consistent polarization direction, and is finally focused by the focusing lens at the focal plane where interference occurs to form a structured beam.

The first beam expander includes a first lens and a second lens. The two lenses constitute the 4F system. The beam sequentially passes through the first lens and the second lens to be expanded to the aperture sizes of the electro-optical phase modulator and the beam shaper.

The beam shaper includes a first axicon lens and a second axicon lens. The first axicon lens and the second axicon lens have exactly the same thicknesses and vertex angles. The vertex angles of the first axicon lens and the second axicon lens are relatively arranged and maintained at a separation distance, so that a circular-shaped beam sequentially passes through the first axicon lens and the second axicon lens to be expanded to form the parallel hollow ring-shaped beam.

The second beam expander includes a third lens and a fourth lens. The third lens and the fourth lens constitute the 4F system. The second path beam sequentially passes through the third lens and the fourth lens to be expanded into the circular-shaped beam exactly complementary to the parallel hollow ring-shaped beam. The parallel hollow ring-shaped beam and the circular-shaped beam have equal area and equal power.

The optical delay line includes a retroreflecting prism and a one-dimensional translation stage. The retroreflecting prism is fixed to the one-dimensional translation stage. The beam is incident on the retroreflecting prism and is reflected from a first reflection surface thereof to a second reflection surface thereof. Then, the beam exits from the second reflection surface in the opposite direction parallel to the incident direction. The refractive index of the internal crystal of the electro-optical phase modulator is very large, resulting in inconsistent optical paths of the two beams. The retroreflecting prism is driven through adjusting the one-dimensional translation stage to be moved back and forth along the incident direction or the exit direction of the beam, so as to adjust the optical paths of the first path beam and the second path beam both from the first polarization beam-splitting prism to the second polarization beam-splitting prism to be equal.

The polarization direction of the linearly polarized beam emitted by the laser is along the horizontal direction, that is, the Z-axis direction as shown in FIG. 1.

The half-wave plate is disposed perpendicular to the propagation direction of the beam, and the optical axis direction thereof has an included angle of 22.5° with the optical axis direction of the linearly polarized beam emitted by the laser, so that the polarized beam exiting from the half-wave plate (3) has equal horizontal polarization component and vertical polarization component.

The polarizing plate is disposed perpendicular to the propagation direction of the beam, and the optical axis direction thereof has an included angle of 45° with the optical axis direction of the linearly polarized beam emitted by the laser, so that the polarizing directions of the first path beam and the second path beam after passing through the polarizing plate (17) are consistent.

2. A structured beam generation method based on beam shaping:

(1) A linearly polarized beam emitted by the laser is incident on the half-wave plate after having an output power adjusted by the electro-optical intensity modulator. The half-wave plate is rotated to be adjusted so that the optical axis direction of the half-wave plate has an included angle of 22.5° with an optical axis direction of the linearly polarized beam emitted by the laser. The polarization direction of the beam after passing through the half-wave plate is rotated to have an included angle of 45° with the optical axis direction of the linearly polarized beam emitted by the laser.

(2) The beam is collimated and expanded by the first beam expander to be consistent with the aperture sizes of the electro-optical phase modulator and the beam shaper, and is then incident into the first polarization beam-splitting prism. The beam is transmitted and reflected at the first polarization beam-splitting prism to be divided into two beams. The transmitted beam is a first path beam. The reflected beam is a second path beam.

(3) The first path beam, after being shaped by the beam shaper to form a parallel hollow ring-shaped beam and having an optical path adjusted by the optical delay line, is reflected by the first reflector to the second polarization beam-splitting prism so as to be transmitted.

(4) The second path beam, after sequentially being phase modulated by the electro-optical phase modulator, reflected by the second reflector, and expanded by the second beam expander, is incident on the second polarization beam-splitting prism so as to be reflected.

The first path beam transmitted by the second polarization beam-splitting prism and the second path beam reflected by the second polarization beam-splitting prism are complementarily combined into a beam exiting from the second polarization beam-splitting prism. The two beams have complementary shapes, equal area, and equal power.

(5) The combined two beams are incident on the polarizing plate, and only the components along the optical axis direction of the polarizing plate pass through the polarizing plate. The amplitudes of the components are equal. The passed through components of the two beams are focused by the focusing lens at the focal plane where interference occurs to generate the structured beam.

The electro-optical phase modulator performs phase modulation on the second path beam that passes therethrough. After the second path beam and the first path beam passed through the second polarization beam-splitting prism, the second path beam generates a phase delay that periodically changes with time relative to the first path beam.

After the modulation of the electro-optical phase modulator, when the first path beam and the second path beam are in phase, constructive interference occurs, and the beam intensity of the light spot of the focused structured beam reaches the maximum value.

After the modulation of the electro-optical phase modulator, when the phase difference between the first path beam and the second path beam is $\pi$, destructive interference occurs, and a majority of the beam intensity of the light spot of the focused structured beam is distributed outside the light spot of the focal plane.

After the modulation of the electro-optical phase modulator, the phase difference between the first path beam and the second path beam periodically changes, and the position of the focused structured beam with the maximum beam intensity moves back and forth on the focal plane of the focusing lens along the horizontal direction.

The beneficial effects of the disclosure are:

The disclosure is based on the beam shaping manner in combination with the polarization beam-splitting prisms to improve the structure of the Mach-Zehnder interferometer, thereby respectively shaping and phase modulating the beams of two optical paths.

Through the special design of the optical path structures, the disclosure eliminates the adverse effects on the system caused by diffraction effects, such as edge diffraction or slit diffraction, in the traditional structured beam generation method or partition modulation method, and improves the beam energy utilization rate and the modulation efficiency, and thus can be applied to fluorescence microscopy imaging, thereby significantly improving the signal-to-noise ratio of a fluorescence microscopy image, well maintaining the diffraction-limited resolution in deep tissue, and improving the imaging effects.

BRIEF DESCRIPTION OF THE DRAWINGS

In order to more specifically explain the technical solutions or details adopted in the disclosure, the following will be described in conjunction with the following drawings. The drawings show the structural diagrams of the device according to the disclosure, list the reference numerals, and make corresponding explanations. The drawings show solutions for beam splitting based on beam shaping of a laser beam by listing non-limiting examples.

Figure 1:
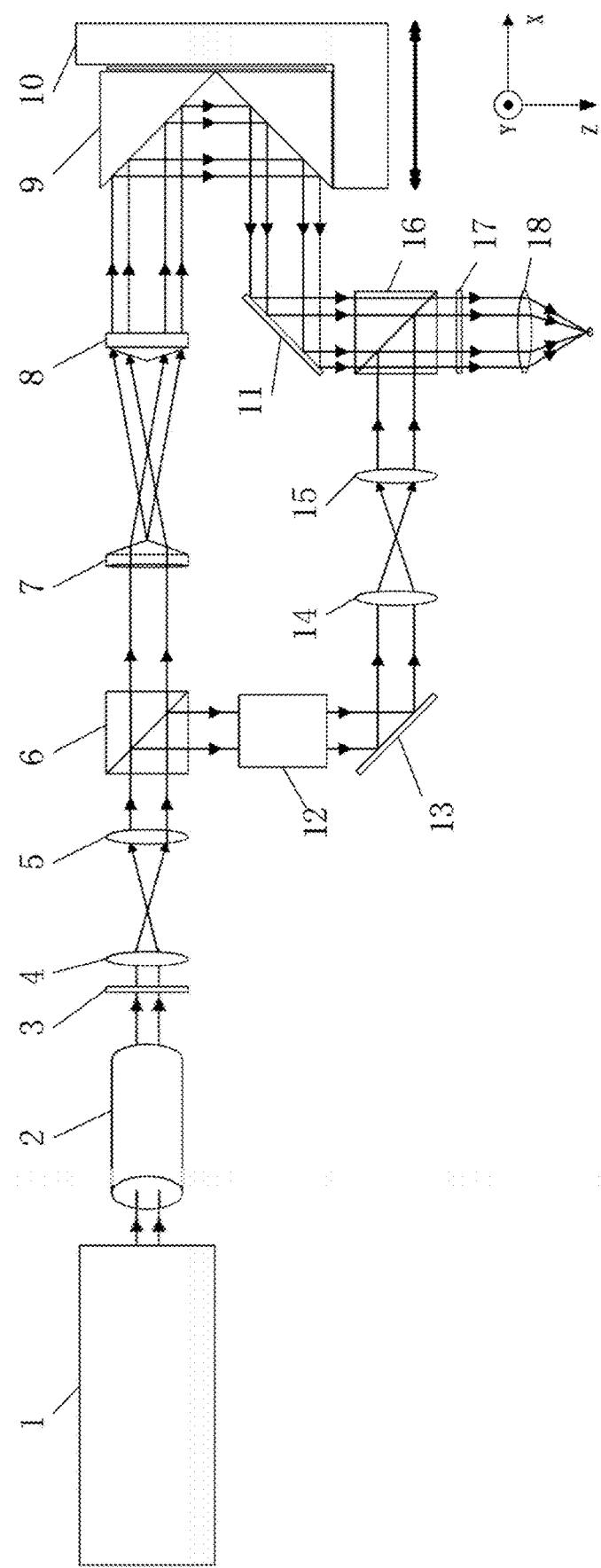
FIG. 1 is a schematic structural diagram of a device according to the disclosure, wherein X-axis, Y-axis, and Z-axis directions in the device are as shown in the bottom right corner of the figure.

In the drawings: laser 1, electro-optical intensity modulator 2, half-wave plate 3, first lens 4, second lens 5, first polarization beam-splitting prism 6, first axicon lens 7, second axicon lens 8, retroreflecting prism 9, one-dimensional translation stage 10, first reflector 11, electro-optical phase modulator 12, second reflector 13, third lens 14, fourth lens 15, second polarization beam-splitting prism 16, polarizing plate 17, and focusing lens 18.

DETAILED DESCRIPTION OF DISCLOSED EMBODIMENTS

The embodiments of the disclosure are described in detail below with reference to the accompanying drawings.

As shown in FIG. 1, the device specifically includes a laser 1, an electro-optical intensity modulator 2, a half-wave plate 3, a first beam expander, a first polarization beam-splitting prism 6, a beam shaper, an optical delay line, a first reflector 11, an electro-optical phase modulator 12, a second reflector 13, a second beam expander, a second polarization beam-splitting prism 16, a polarizing plate 17, and a focusing lens 18 on optical paths thereof.

As shown in FIG. 1, a linearly polarized beam emitted by the laser 1, after sequentially being power modulated by the electro-optical intensity modulator 2, polarization state adjusted by the half-wave plate 3, collimated and expanded by the first beam expander, and incident on the first polarization beam-splitting prism 6, is transmitted and reflected to be divided into two beams with equal power. The two beams propagate in the structured optical path of the improved Mach-Zehnder interferometer. The beam transmitted by the first polarization beam-splitting prism 6 is a first path beam, which is substantially a horizontally polarized beam. The first path beam, after sequentially being shaped by the beam shaper into a parallel hollow ring-shaped beam and adjusted in an optical path difference thereof by the optical delay line, is reflected by the first reflector 11 and is then incident on the second polarization beam-splitting prism 16 so as to be transmitted. The beam reflected by the first polarization beam-splitting prism 6 is a second path beam, which is substantially a vertically polarized beam. The second path beam, after sequentially being phase modulated by the electro-optical phase modulator 12, reflected by the second reflector 13, and expanded by the second beam expander, is incident on the second polarization beam-splitting prism 16 so as to be reflected. The first path beam transmitted by the second polarization beam-splitting prism 16 and the second path beam reflected by the second polarization beam-splitting prism 16 are complementarily combined into a beam that incidents on the polarizing plate 17, which is then adjusted by the polarizing plate 17 into a beam with consistent polarization direction, and is finally focused by the focusing lens 18 at the focal plane where interference occurs to form a structured beam.

The first beam expander includes a first lens 4 and a second lens 5. The two lenses constitute the 4F system. The beam sequentially passes through the first lens 4 and the second lens 5 to be expanded to the aperture sizes of the electro-optical phase modulator 12 and the beam shaper.

The beam shaper includes a first axicon lens 7 and a second axicon lens 8. The first axicon lens 7 and the second axicon lens 8 have exactly the same thicknesses and vertex angles. The vertex angles of the first axicon lens 7 and the second axicon lens 8 are relatively arranged and maintained at a separation distance, so that a circular-shaped beam sequentially passes through the first axicon lens 7 and the second axicon lens 8 to be expanded to form the parallel hollow ring-shaped beam. The second beam expander includes a third lens 14 and a fourth lens 15. The third lens 14 and the fourth lens 15 constitute the 4F system. The second path beam sequentially passes through the third lens 14 and the fourth lens 15 to be expanded into the circular-shaped beam exactly complementary to the parallel hollow ring-shaped beam. That is, the inner diameter of the parallel hollow ring-shaped beam and the outer diameter of the circular-shaped beam are the same, so that the circular-shaped beam just fills the gap in the middle of the parallel hollow ring-shaped beam. The parallel hollow ring-shaped beam and the circular-shaped beam have equal area and equal power.

The optical delay line includes a retroreflecting prism 9 and a one-dimensional translation stage 10 moving along the X-axis direction. The X-axis direction is the beam output direction of the laser. The retroreflecting prism 9 is fixed to the one-dimensional translation stage 10. The beam is incident on the retroreflecting prism 9 and is reflected from a first reflection surface thereof to a second reflection surface thereof. Then, the beam exits from the second reflection surface in the direction parallel to the X-axis. The retroreflecting prism 9 is driven through adjusting the one-dimensional translation stage 10 to be moved back and forth along the X-axis direction, so as to adjust the optical paths of the first path beam and the second path beam to be equal.

As shown in FIG. 1, the polarization direction of the linearly polarized beam emitted by the laser is along the Z-axis direction. The half-wave plate and the polarizing plate are both disposed perpendicular to the propagation direction of the beam. The optical axis direction of the half-wave plate has an included angle of 22.5° with the optical axis direction of the linearly polarized beam emitted by the laser. The optical axis direction of the polarizing plate has an included angle of 45° to the optical axis direction of the linearly polarized beam emitted by the laser.

The embodiments of the disclosure and the specific process are as follows:

(1) The linearly polarized beam emitted by the laser 1 is incident on the half-wave plate 3 after an output power is adjusted by the electro-optical intensity modulator 2. For example, the laser may be a HeNe laser with 632.8 nm. The vibration direction of the exiting linearly polarized beam is the horizontal direction, that is, the Z-axis direction as shown in FIG. 1. Then, the half-wave plate 3 is rotated to be adjusted so that the optical axis direction of the half-wave plate 3 has an included angle of 22.5° with the optical axis direction of the linearly polarized beam emitted by the laser 1. The polarization direction of the beam after passing through the half-wave plate 3 is rotated to have an included angle of 45° with the optical axis direction of the linearly polarized beam emitted by the laser 1.

(2) The beam is collimated and expanded by the first beam expander to be consistent with the aperture sizes of the electro-optical phase modulator 12 and the beam shaper, and is then incident into the first polarization beam-splitting prism 6. For example, the diameter of the beam is expanded from 1 mm to 2 mm. The beam is transmitted and reflected at the first polarization beam-splitting prism 6 to be divided into two beams. The transmitted beam is the first path beam, which is substantially a horizontally polarized beam. The reflected beam is the second path beam, which is substantially a vertically polarized beam.

(3) The horizontally polarized beam transmitted through the first polarization beam-splitting prism 6, that is, the first path beam, after being shaped by the beam shaper to form the parallel hollow ring-shaped beam and having the optical path adjusted by the optical delay line, is reflected by the first reflector 11 to the second polarization beam-splitting prism 16 so as to be transmitted.

Figure 2:
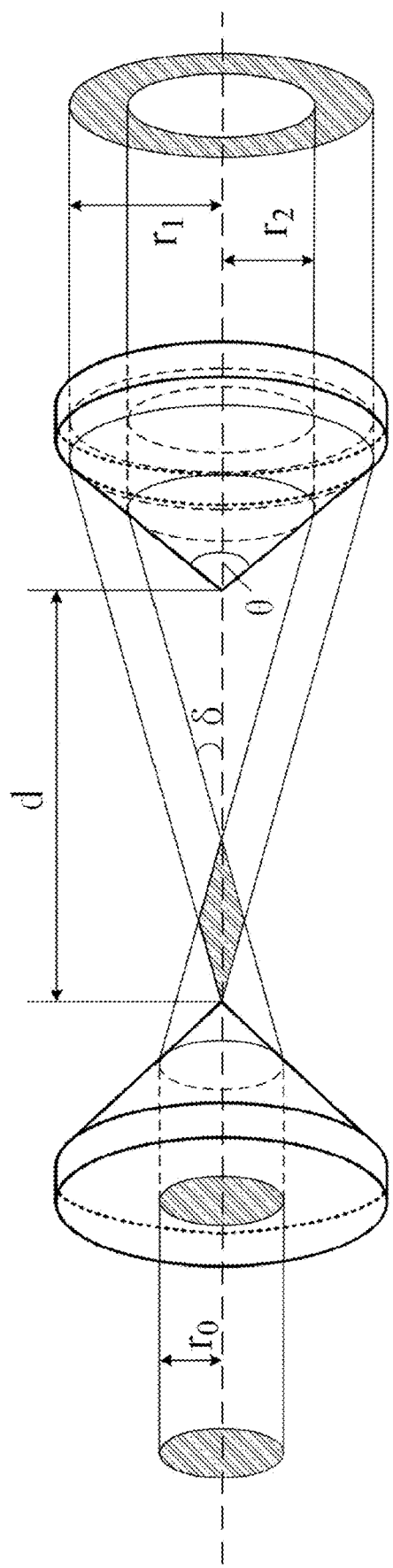
FIG. 2 is a schematic diagram illustrating the principle of beam shaping according to the disclosure.

As shown in FIG. 2, the first path beam is irradiated onto the plane of the first axicon lens 7 of the beam shaper. The center of the beam coincides with the optical axis direction of the axicon lens. The second axicon lens 8 and the first axicon lens 7 are coaxially and relatively disposed. The beam passes through the beam shaper to form the parallel hollow ring-shaped beam. The difference between the inner and outer radii of the ring-shaped beam is equal to the radius of the original incident beam. Through adjusting the distance between the two axicon lenses, a ring-shaped beam with an inner and outer circle area of 1:2 may be formed. For example, for axicon lenses with a vertex angle of 140° made of N-BK7 optical glass with a refractive index of 1.4515, the distance between the vertexes of the conical surfaces of the two axicon lenses is 18.596 mm, the diameter of the inner circle of the beam after shaping is 4.83 mm, and the diameter of the outer circle is 6.83 mm.

(4) The vertically polarized beam reflected from the first polarization beam-splitting prism 6, that is, the second path beam, after sequentially being phase modulated by the electro-optical phase modulator 12, reflected by the second reflector 13, and expanded by the second beam expander, is incident to the second polarization beam-splitting prism 16 so as to be reflected.

Figure 3:
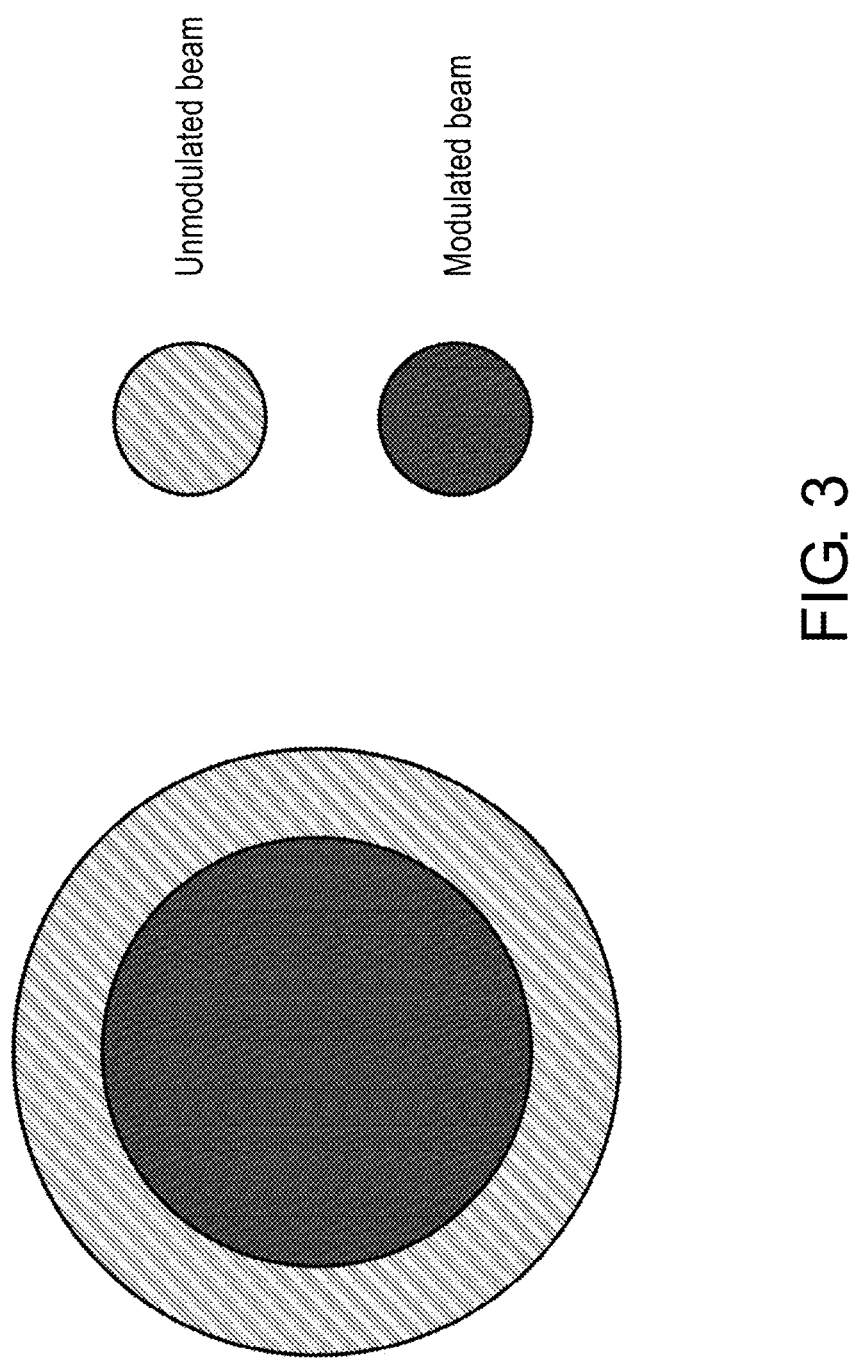
FIG. 3 is an example of an external ring-shaped beam and a complementary internal circular-shaped beam according to a beam splitting modulation solution of the disclosure.

As shown in FIG. 3, the first path beam transmitted by the second polarization beam-splitting prism 16 and the second path beam reflected by the second polarization beam-splitting prism 16 are complementarily combined into form a beam exiting from the second polarization beam-splitting prism 16. The two beams have complementary shapes, equal area, and equal power. For example, the diameter of the circular-shaped beam expanded by the second beam expander is 4.83 mm, which is equal to the inner diameter of the parallel hollow ring-shaped beam.

(5) Finally, the combined two beams are incident on the polarizing plate 17, and only the components along the optical axis direction of the polarizing plate 17 pass through the polarizing plate 17. The amplitudes of the components are equal. The passed through components of the two beams are focused by the focusing lens 18 at the focal plane where interference occurs to generate the structured beam.

The electro-optical phase modulator 12 performs phase modulation on the second path beam that passed therethrough. After the second path beam and the first path beam passed through the second polarization beam-splitting prism 16, the second path beam generates a phase delay that periodically changes with time relative to the first path beam.

Figure 4:
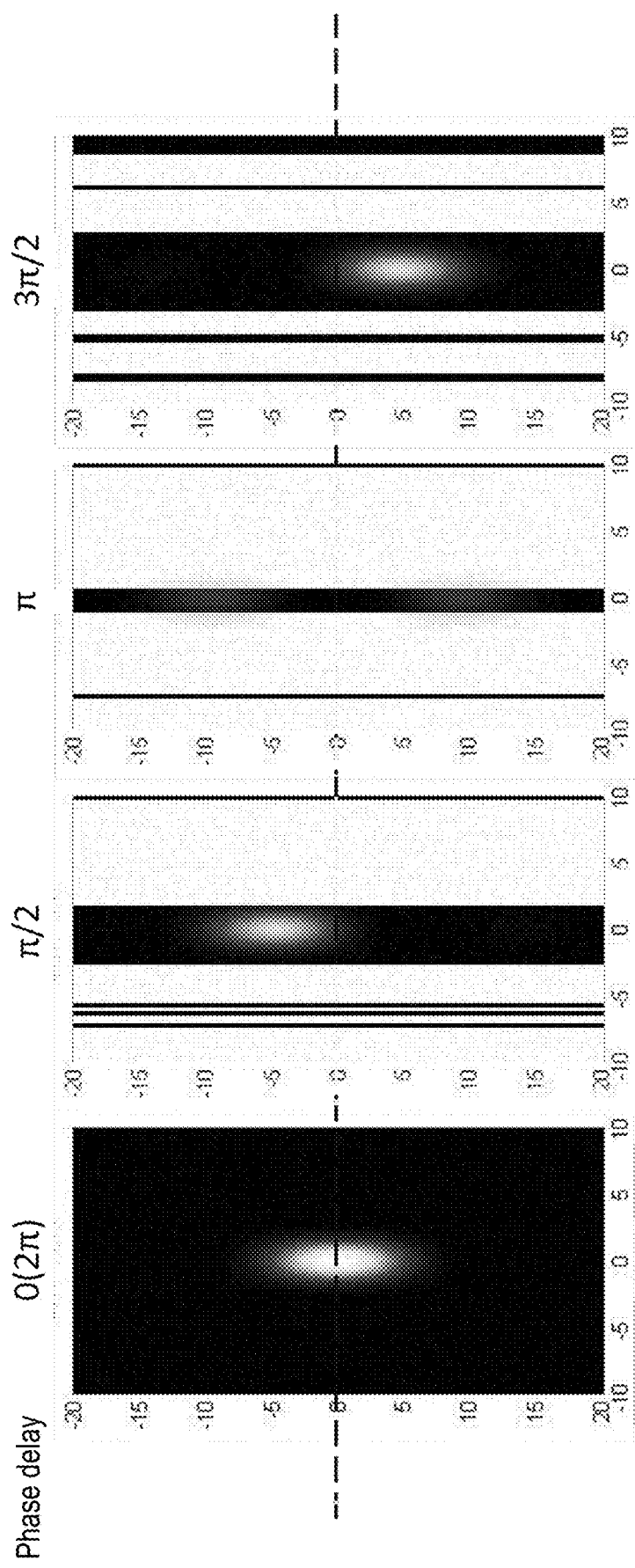
FIG. 4 is a beam intensity distribution diagram of a focal plane region according to an embodiment, which varies as the phase difference between modulated beam and unmodulated beam changes.

In specific implementation, the electro-optical phase modulator 12 modulates and controls the movement of the light spot in the following manner:

After the modulation of the electro-optical phase modulator 12, when the first path beam and the second path beam are in phase, constructive interference occurs, and the beam intensity of the light spot of the focused structured beam reaches the maximum value. After the modulation of the electro-optical phase modulator 12, when the phase difference between the first path beam and the second path beam is $\pi$, destructive interference occurs, and a majority of the beam intensity of the light spot of the focused structured beam is distributed outside the light spot of the focal plane. After the modulation of the electro-optical phase modulator 12, the phase difference between the first path beam and the second path beam periodically changes, and the position of the focused structured beam with the maximum beam intensity moves back and forth on the focal plane of the focusing lens 18 along the X-axis direction. The results under different phases are shown in FIG. 4.

The principle of beam shaping according to the disclosure is as follows:

As shown in FIG. 2, a pair of positive axicon lenses with the same vertex angles of the conical surfaces are combined into a new ring-shaped beam expander to implement the shaping of a parallel Gaussian beam to a hollow Gaussian beam. An outer diameter $r_1$ of the ring-shaped beam shaped by such method is:

$$r_1 = \frac{d\tan\delta}{1 - \tan\varphi\tan\delta}$$

An inner diameter $r_2$ is:

$$r_2 = r_1 - r_0$$

Where, $r^0$ is the radius of the original incident beam, $\varphi$ is the edge angle of the axicon lens and $\varphi=(180°-\theta)/2$, $\theta$ is the vertex angle of the axicon lens, $\delta$ is the deflection angle of the beam between the two axicon lenses and $\delta=\sin^{-1}(n \sin \varphi)-\varphi$, n is the vertex angle of the axicon lens, and d is the distance between the vertex of the two axicon lenses.

After beam shaping by the axicon lenses, the shape of the target shaped beam is the hollow Gaussian beam with the functional form of the light field generally expressed as:

$$P(r)=(r^2/w^2)^m\exp(-r^2/w^2)$$

Where, m is the order of the hollow Gaussian beam, w is the waist radius of the Gaussian beam, and r is the radial coordinate of the beam after shaping.

In summary, the disclosure adopts the manner based on beam shaping in combination with the polarization beam-splitting prisms to improve the structure of the Mach-Zehnder interferometer, thereby respectively shaping and phase modulating the beams of two optical paths. The adverse effects on the system caused by diffraction effects, such as edge diffraction or slit diffraction, in the traditional structured beam generation method or partition modulation method are completely eliminated, thereby improving the beam energy utilization rate and the modulation efficiency of the focal plane, so that stray light and background noise during the fluorescence microscopy imaging process are effectively suppressed, which can significantly improve the signal-to-noise ratio of the fluorescence microscopy image, well maintain the diffraction-limited resolution in deep tissue, and provide more reasonable and effective solutions for deep-layer non-destructive imaging of biological tissue.

What is claimed is:

1. A structured beam generation device based on beam shaping, comprising: a laser (1), an electro-optical intensity modulator, a half-wave plate, a first beam expander, a first polarization beam-splitting prism, a beam shaper, an optical delay line, a first reflector, an electro-optical phase modulator, a second reflector, a second beam expander, a second polarization beam-splitting prism, a polarizing plate, and a focusing lens on optical paths of the structured beam generation device;

wherein a linearly polarized beam emitted by the laser, after sequentially being power modulated by the electro-optical intensity modulator, polarization state adjusted by the half-wave plate, collimated and expanded by the first beam expander, and incident on the first polarization beam-splitting prism, is transmitted and reflected to be divided into two beams with equal power;

the beam transmitted by the first polarization beam-splitting prism is a first path beam, wherein the first path beam, after sequentially being shaped by the beam shaper into a parallel hollow ring-shaped beam and adjusted in an optical path difference thereof by the optical delay line, is reflected by the first reflector and is then incident on the second polarization beam-splitting prism so as to be transmitted;

the beam reflected by the first polarization beam-splitting prism is a second path beam, wherein the second path beam, after sequentially being phase modulated by the electro-optical phase modulator, reflected by the second reflector, and expanded by the second beam expander, is incident on the second polarization beam-splitting prism so as to be reflected; and the first path beam transmitted by the second polarization beam-splitting prism and the second path beam reflected by the second polarization beam-splitting prism are complementarily combined into a beam incident on the polarizing plate, which is then adjusted by the polarizing plate into a beam with consistent polarization direction, and is finally focused by the focusing lens at a focal plane where interference occurs to form a structured beam.

2. The structured beam generation device based on beam shaping according to claim 1, wherein the first beam expander comprises a first lens and a second lens, the two lenses constitute a 4F system, and the beam sequentially passes through the first lens and the second lens to be expanded to aperture sizes of the electro-optical phase modulator and the beam shaper.

3. The structured beam generation device based on beam shaping according to claim 1, wherein the beam shaper comprises a first axicon lens and a second axicon lens, the first axicon lens and the second axicon lens have exactly the same thicknesses and vertex angles, and the vertex angles of the first axicon lens and the second axicon lens are relatively arranged and maintained at a separation distance, so that a circular-shaped beam sequentially passes through the first axicon lens and the second axicon lens to be expanded to form the parallel hollow ring-shaped beam; and the second beam expander comprises a third lens and a fourth lens, the third lens and the fourth lens constitute a 4F system, the second path beam sequentially passes through the third lens and the fourth lens to be expanded into the circular-shaped beam exactly complementary to the parallel hollow ring-shaped beam, and the parallel hollow ring-shaped beam and the circular-shaped beam have an equal area and an equal power.

4. The structured beam generation device based on beam shaping according to claim 1, wherein the optical delay line comprises a retroreflecting prism and a one-dimensional translation stage, the prism reflector is fixed to the one-dimensional translation stage, the beam is incident on the retroreflecting prism and is reflected from a first reflection surface thereof to a second reflection surface thereof, and then exits from the second reflection surface in an opposite direction parallel to an incident direction, and the retroreflecting prism is driven through adjusting the one-dimensional translation stage to be moved back and forth along the incident direction or an exit direction of the beam, so as to adjust optical paths of the first path beam and the second path beam both from the first polarization beam-splitting prism to the second polarization beam-splitting prism to be equal.

5. The structured beam generation device based on beam shaping according to claim 1, wherein the half-wave plate is disposed perpendicular to a propagation direction of the beam, and an optical axis direction thereof is adjusted to have an included angle of 22.5° with an optical axis direction of the linearly polarized beam emitted by the laser.

6. The structured beam generation device based on beam shaping according to claim 1, wherein the polarizing plate is disposed perpendicular to a propagation direction of the beam, and an optical axis direction thereof has an included angle of 45° with an optical axis direction of the linearly polarized beam emitted by the laser.

7. A structured beam generation method based on beam shaping, adopting the device according to claim 1 and comprising:

emitting a linearly polarized beam by the laser which is to be incident on the half-wave plate after having an output power adjusted by the electro-optical intensity modulator, rotating and adjusting the half-wave plate so that an optical axis direction of the half-wave plate has an included angle of 22.5° with an optical axis direction of the linearly polarized beam emitted by the laser, and rotating a polarization direction of the beam after passing through the half-wave plate so as to have an included angle of 45° with the optical axis direction of the linearly polarized beam emitted by the laser;

collimating and expanding the beam, by the first beam expander to be consistent with aperture sizes of the electro-optical phase modulator and the beam shaper, which is then incident into the first polarization beam-splitting prism, and transmitting and reflecting the beam at the first polarization beam-splitting prism to be divided into two beams, wherein the transmitted beam is a first path beam and the reflected beam is a second path beam;

having the first path beam, after being shaped by the beam shaper to form a parallel hollow ring-shaped beam and adjusted in an optical path thereof by the optical delay line, to be reflected by the first reflector to the second polarization beam-splitting prism so as to be transmitted;

having the second path beam, after sequentially being phase modulated by the electro-optical phase modulator, reflected by the second reflector, and expanded by the second beam expander, to be incident on the second polarization beam-splitting prism so as to be reflected; wherein the first path beam transmitted by the second polarization beam-splitting prism and the second path beam reflected by the second polarization beam-splitting prism are complementarily combined into a beam exiting from the second polarization beam-splitting prism, and the first and second path beams have complementary shapes, an equal area, and an equal power; and having the combined beam to be incident on the polarizing plate, wherein only components along an optical axis direction of the polarizing plate pass through the polarizing plate, amplitudes of the components are equal, and the passed through components of the combined beam are focused by the focusing lens at the focal plane where interference occurs to generate the structured beam.

8. The structured beam generation method based on beam shaping according to claim 7, wherein the electro-optical phase modulator performs phase modulation on the second path beam that passes therethrough, and after the second path beam and the first path beam passed through the polarizing plate, the second path beam generates a phase delay that periodically changes with time relative to the first path beam.

9. The structured beam generation method based on beam shaping according to claim 7, wherein after being modulated by the electro-optical phase modulator, when the first path beam and the second path beam are in phase, constructive interference occurs, and a beam intensity of a light spot of a focused structured beam reaches a maximum value;

after being modulated by the electro-optical phase modulator, when a phase difference between the first path beam and the second path beam is $\pi$, destructive interference occurs, and a majority of the beam intensity of the light spot of the focused structured is distributed outside a light spot of the focal plane; and after being modulated by the electro-optical phase modulator, the phase difference between the first path beam and the second path beam periodically changes, and a position of the focused structured beam with a maximum beam intensity moves back and forth on the focal plane of the focusing lens along a horizontal direction.

* * * * *